(12) United States Patent
Fan

(10) Patent No.: US 9,274,264 B2
(45) Date of Patent: Mar. 1, 2016

(54) LIGHT SOURCE MODULE

(71) Applicant: HTC Corporation, Taoyuan County (TW)

(72) Inventor: Fu-Cheng Fan, Taoyuan County (TW)

(73) Assignee: HTC Corporation, Taoyuan (TW)

(*) Notice: Subject to any disclaimer, the term of this patent is extended or adjusted under 35 U.S.C. 154(b) by 0 days.

(21) Appl. No.: 13/890,262

(22) Filed: May 9, 2013

(65) Prior Publication Data
US 2014/0332829 A1    Nov. 13, 2014

(51) Int. Cl.
*F21V 8/00* (2006.01)
*H01L 25/075* (2006.01)
*H01L 33/50* (2010.01)
*G02F 1/1335* (2006.01)
*B82Y 15/00* (2011.01)

(52) U.S. Cl.
CPC ............. *G02B 6/005* (2013.01); *G02B 6/0001* (2013.01); *G02B 6/0023* (2013.01); *G02F 1/133609* (2013.01); *B82Y 15/00* (2013.01); *G02B 6/0018* (2013.01); *G02F 1/133603* (2013.01); *H01L 25/075* (2013.01); *H01L 25/0753* (2013.01); *H01L 33/50* (2013.01); *H01L 33/502* (2013.01); *H01L 2924/00* (2013.01); *H01L 2924/0002* (2013.01)

(58) Field of Classification Search
None
See application file for complete search history.

(56) References Cited

U.S. PATENT DOCUMENTS

| 8,317,348 | B2 | 11/2012 | Yoo et al. |
| 8,353,613 | B2 | 1/2013 | Choi et al. |
| 2004/0012027 | A1 | 1/2004 | Keller et al. |
| 2008/0048193 | A1 | 2/2008 | Yoo et al. |
| 2009/0195494 | A1 | 8/2009 | Ueda |
| 2010/0123155 | A1* | 5/2010 | Pickett ................. B82Y 15/00 257/98 |
| 2010/0243053 | A1 | 9/2010 | Coe-Sullivan et al. |
| 2010/0244731 | A1 | 9/2010 | Kaihotsu et al. |
| 2011/0186811 | A1* | 8/2011 | Coe-Sullivan ......... G02B 6/005 257/13 |
| 2012/0113672 | A1* | 5/2012 | Dubrow ................ B82Y 20/00 362/602 |
| 2013/0050612 | A1* | 2/2013 | Hur .................. G02F 1/133603 349/62 |
| 2013/0271948 | A1 | 10/2013 | Chang et al. |
| 2013/0335677 | A1* | 12/2013 | You .................. G02F 1/133609 349/65 |
| 2014/0264359 | A1 | 9/2014 | Zimmerman et al. |

FOREIGN PATENT DOCUMENTS

| CN | 102297369 | 12/2011 |
| CN | 102536544 | 7/2012 |
| CN | 202511145 | 10/2012 |
| CN | 202561652 | 11/2012 |
| CN | 103032765 | 4/2013 |
| CN | 202884679 | 4/2013 |
| TW | 201244186 | 11/2012 |

OTHER PUBLICATIONS

"Office Action of US Counterpart Application", issued on Mar. 27, 2015, p. 1-p. 38.
"Office Action of Taiwan Counterpart Application", issued on Feb. 26, 2015, p. 1-p. 6.
"Office Action of China Counterpart Application," issued on Sep. 25, 2015, p. 1-p. 8.

* cited by examiner

*Primary Examiner* — Steven Loke
*Assistant Examiner* — Juanita Rhodes
(74) *Attorney, Agent, or Firm* — Jianq Chyun IP Office

(57) ABSTRACT

A light source module includes a light guide element, at least one light-emitting element, and a quantum dot element. The light guide element has a light incident surface and a light exiting surface. The light-emitting element is disposed at the light incident surface for providing a first color light. The quantum dot element converts only a portion of the first color light into a first monochromatic light. The first color light and the first monochromatic light are mixed into a white light.

9 Claims, 3 Drawing Sheets

LIGHT SOURCE MODULE

TECHNICAL FIELD

The invention relates to a light source module, and more particularly to a light source module having a quantum dot element.

DESCRIPTION OF RELATED ART

With advancement of the technology, people tend to rely on electronic devices to a greater degree. Nowadays, users expect a light, thin, compact and high performance electronic device. Therefore, various portable electronic devices such as ultra mobile personal computers (UMPCs), tablet PCs, pocket PCs, personal digital assistants (PDAs), cellular phones, and notebook PCs have been developed accordingly. In order to satisfy the user with regards to the image display effects of these types of portable electronic devices, high resolution display panels have been broadly adopted. Since the display panel is not self-luminescent, a light source module is disposed under the display panel to serve as the display light source of the display panel.

Quantum dots are a material having preferable light absorption and luminescent properties, with narrow full width at half maximum, high light-emitting efficiency, and wide absorption spectrums. Therefore, quantum dots possess high color purity and saturation, and they are being widely applied in display panel techniques in recent years. To enhance the color brightness and saturation of the display panel, an important area of focus is how to apply quantum dots in light source modules to increase the light-emitting efficiency of the light source modules while saving production costs at the same time.

SUMMARY

The invention provides a light source module capable of reducing the production costs of the quantum dot element while enhancing color saturation and brightness.

An optical module according to an embodiment of the invention includes a light guide element, at least one light-emitting element, and a quantum dot element. The light guide element has a light incident surface and a light exiting surface. The light-emitting element is disposed at the light incident surface and provides a first color light. The quantum dot element converts only a portion of the first color light into a first monochromatic light, in which the first color light and the first monochromatic light are mixed into a white light.

According to an embodiment of the invention, the quantum dot element is disposed at the light exiting surface of the light guide element.

According to an embodiment of the invention, the light guide element has a wedge-shaped portion on a side near the light incident surface, the quantum dot element having a light shielding portion above the wedge-shaped portion.

According to an embodiment of the invention, the quantum dot element is disposed between the light-emitting element and the light guide element.

According to an embodiment of the invention, the light source module further includes a reflector element disposed on a bottom surface of the light guide element opposite to the light exiting surface.

According to an embodiment of the invention, the quantum dot element is disposed between the light guide element and the reflector element.

According to an embodiment of the invention, the quantum dot element has an optical film coating on a side facing the light guide element for reflecting the first monochromatic light.

According to an embodiment of the invention, the first monochromatic light is a red light, and the first color light includes a blue light and a green light.

According to an embodiment of the invention, the first color light further includes a yellow light.

According to an embodiment of the invention, the light-emitting element includes a blue light-emitting diode (LED) chip and a green phosphor, in which the green phosphor converts a portion of a blue light provided by the blue LED chip into a green light.

According to an embodiment of the invention, the light-emitting element includes a blue LED chip and a green LED chip.

According to an embodiment of the invention, the first monochromatic light is an infrared light.

According to an embodiment of the invention, the infrared light has a wavelength between 850 nm to 940 nm.

According to an embodiment of the invention, the light source module further includes a brightness enhancement film, wherein the quantum dot element is disposed between the brightness enhancement film and the light exiting surface.

In summary, in the light source modules according to the embodiments of the invention, since the quantum dot element only needs to convert light of a specific wavelength, the production costs of the quantum dot element can be effectively reduced while enhancing the color saturation of the first monochromatic light.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF EMBODIMENTS

Figure 1A:
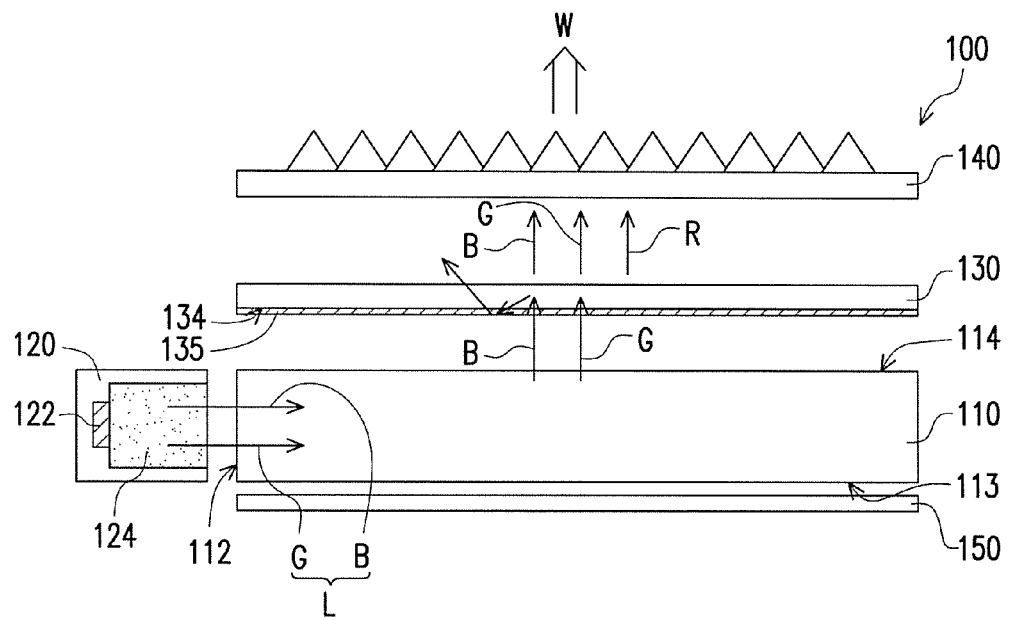
FIG. 1A is a schematic cross-sectional view of a light source module according to an embodiment of the invention.

FIG. 1A is a schematic cross-sectional view of a light source module according to an embodiment of the invention. With reference to FIG. 1A, a light source module 100 of the present embodiment includes a light guide element 110, at least one light-emitting element 120, and a quantum dot element 130. The light guide element 110 has a light incident surface 112 and a light exiting surface 114. The light-emitting element 120 is disposed at the light incident surface 112 for providing a first color light L. The quantum dot element 130 converts only a portion of the first color light L into a first monochromatic light R, in which the first color light L and the first monochromatic light are mixed into a white light W.

In the present embodiment, the light source module 100 may be a display light source required by a display panel in a mobile phone or a tablet PC. For example, in FIG. 1A, the quantum dot element 130 is disposed on the light exiting surface 114 of the light guide element 110. After the first color light L provided by the light-emitting element 120 exits from the light exiting surface 114 of the light guide surface 114, a portion of the first color light L is converted by the quantum dot element 130 into the first monochromatic light R. The quantum dot element 130 in the present embodiment is coated on a film, and the wavelength of the converted light is adjusted by changing the particle diameters of the quantum dots. In other words, if the quantum dot element 130 only needs to convert the first color light L into the first monochromatic light R having a single wavelength, then the quantum dots of the quantum dot element 130 only needs the same particle diameter. This greatly reduces the production costs of the light source module 100.

In specifics, the quantum dot element 130 is formed by two transparent plates and a quantum dot layer sandwiched between the two transparent plates. The quantum dot layer includes quantum dots of uniform quality, size, and/or type. Concurrently, the first color light L is formed by a second monochromatic light and a third monochromatic light. Moreover, he second monochromatic light may be a blue light B, and the third monochromatic light may be a green light G. The quantum dot element 130 converts only the monochromatic light portion in the first color light L into the first monochromatic light R. For example, the portion of the blue light B is converted into the first monochromatic light R, and the remaining portion of the blue light B passes through along with the green light G. The remaining portion of the blue light B and the green light G which were passed through are mixed with the first monochromatic light R converted from the portion of the blue light B into the white light W.

In other embodiments which are not illustrated, the second monochromatic light and the third monochromatic light included in the first color light may be respectively a blue light and a red light, and the first monochromatic light converted by the quantum dot element is a green light. At this time, the quantum dots included in the quantum dot element may be configured to convert one portion of monochromatic light from the second monochromatic light and the third monochromatic light into the first monochromatic light. For example, the portion of the second monochromatic light is converted into the first monochromatic light, or the portion of the third monochromatic light is converted into the first monochromatic light.

In addition, since the quantum dot element 130 adopts a quantum dot material having a single particle diameter, to uniformly distribute such a quantum material with the single particle diameter is relatively simple, which increases the production yield of the quantum dot element 130. By contrast, if the quantum dot element 130 adopts quantum dot materials with a multitude of particle diameters, and the quantum dot material with different particle diameters need to be uniformly distributed on the film, then the production difficulties would be drastically increased, and the production yield would be much lower.

In FIG. 1A, the first color light L provided by the light-emitting element 120 may be formed by the blue light B and the green light G, and the quantum dot element 130 includes a plurality of quantum dots having the same particle diameter (e.g. 5 μm). The quantum dots can convert only a portion of the first color light L into the first monochromatic light R, and the first monochromatic light R is a red light. Thereafter, the white light W needed by the light source module 100 can be obtained by mixing the first color light L formed by the blue light B and the green light G with the first monochromatic light R having a red light wavelength. In the present embodiment, since the green light G is directly provided by the light-emitting element 120 without the need for conversion by the quantum dot element 130, a preferable light utilization rate can be achieved, and the brightness of the light source device 100 can be enhanced. Moreover, light converted by the quantum dot element 130 has a preferable color rendering property. Therefore, if the first monochromatic light R having the red light wavelength is converted by the quantum dot element 130, then the color saturation of the red color rendered by the display panel can be increased.

In FIG. 1A, the light-emitting element 120 is disposed on a side of the light guide element 110, and the light-emitting element 120 includes a second monochromatic light-emitting diode (LED) chip 122 and a third monochromatic light-emitting phosphor 124, such as a blue LED chip 122 and a green phosphor 124, for example. The green phosphor 124 converts the portion of the blue light B provided by the blue LED chip 122 into the green light G, so the light-emitting element 120 can provide the blue light B and the green light G. However, the invention does not limit the structural composition of the light-emitting element 120. Another embodiment is detailed below to describe a variation of the configuration of the light source module.

Figure 1B:
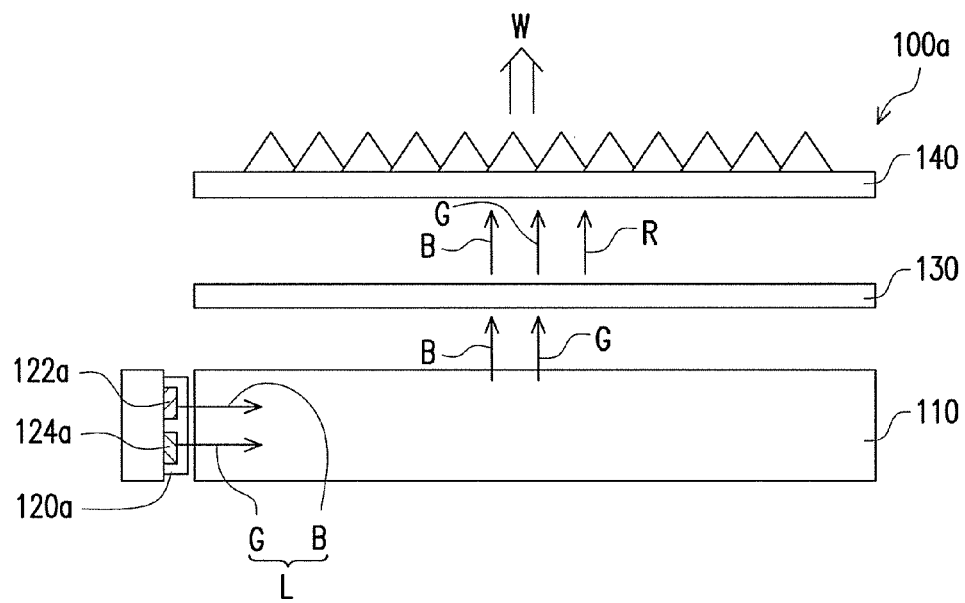
FIG. 1B is a schematic view of a light source module according to another embodiment of the invention.

FIG. 1B is a schematic view of a light source module according to another embodiment of the invention. In FIG. 1B, a light source module 100a is differs from the light source module 100 of FIG. 1A only in the structural composition of a light-emitting element 120a depicted in FIG. 1B. The light-emitting element 120 of FIG. 1B is disposed on a side of the light guide element 110, and the light-emitting element 120 includes a second monochromatic LED chip 122a and a third monochromatic LED chip 124a, such as a blue LED chip 122a and a green LED chip 124a. The light-emitting element 120a mixes the first color light L obtained by mixing the blue light B and the green light G from the blue LED chip 122a and the green LED chip 124a, with the first monochromatic light R converted by the quantum dot element 130 to form the white light W.

In the foregoing embodiments, the first color light L is formed by the blue light B and the green light G. Nevertheless, the invention should not be construed as limited to the embodiments set forth herein. In other embodiments that are not illustrated, the first color light L may also be formed by mixing light of other wavelengths, and the first monochromatic light R may have light of other wavelengths. For example, the light source module 100 may be applied as backlight modules in the screens of electronic devices such as the smartphone or the tablet PC. The first monochromatic light R may be an infrared light having a wavelength between 850 nm to 940 nm. Alternatively, the quantum dots included in the quantum dot element 130 can convert a portion of the first color light L into a first monochromatic light R having a monochromatic visible light and an invisible infrared light. Correspondingly, an infrared sensor or a color image sensor capable of sensing infrared light (not drawn) is further disposed on a side opposite to the emitting light of the light module in the smartphone or tablet PC. Based on sensing the infrared portion of the reflected light and determining a user gesture variation outside of the smartphone or tablet PC, this type of sensor can correspondingly generate a control signal.

Moreover, in the embodiment depicted by FIG. 1A, the light source module 100 further includes a reflector element 150 disposed on a bottom surface 113 of the light guide element 110 opposite to the light exiting surface 114, and the light guide element 110 is disposed between the quantum dot element 130 and the reflector element 150. Furthermore, the quantum dot element 130 has an optical film coating 135 on a side 134 facing the light guide element 110 for reflecting the first monochromatic light R. In other words, after the first monochromatic light R enters the quantum dot element 130 from the light exiting surface 114 of the light guide element 110, due optical film coating 135 of the quantum dot element 130 facing the light guide element 110, the first monochromatic light R is prevented from being reflected again back to the light guide element 110, thereby enhancing the light-emitting efficiency of the light source module 100. Moreover, the light source module 100 may further include at least one brightness enhancement film 140, in which the quantum dot element 130 is disposed between the brightness enhancement film 140 and the light exiting surface 114. The brightness enhancement film 140 can bend light toward the front viewing direction and has a light concentrating brightness enhancement effect. Therefore, the brightness of the light source module 100 can be further increased.

Figure 2A:
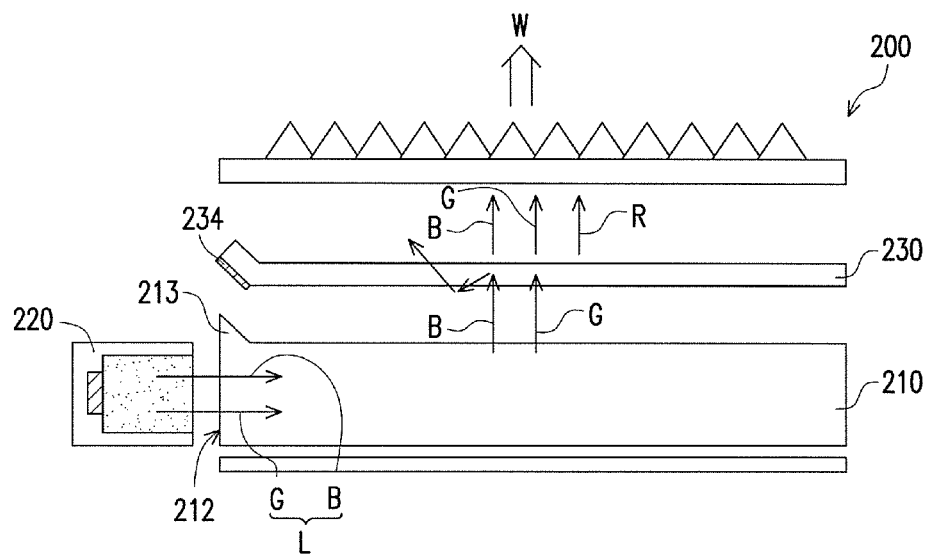
FIG. 2A is a schematic view of a light source module according to another embodiment of the invention.
Figure 2B:
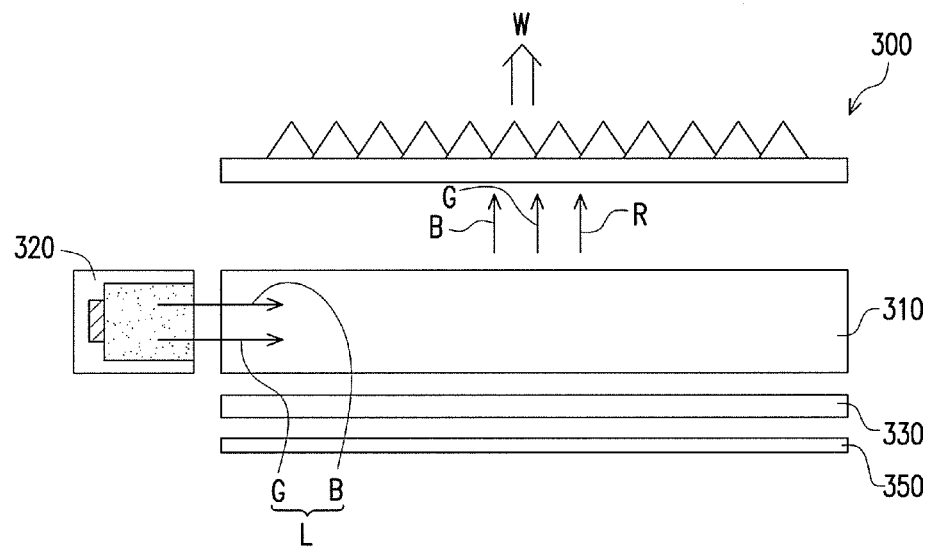
FIG. 2B is a schematic view of a light source module according to another embodiment of the invention.
Figure 2C:
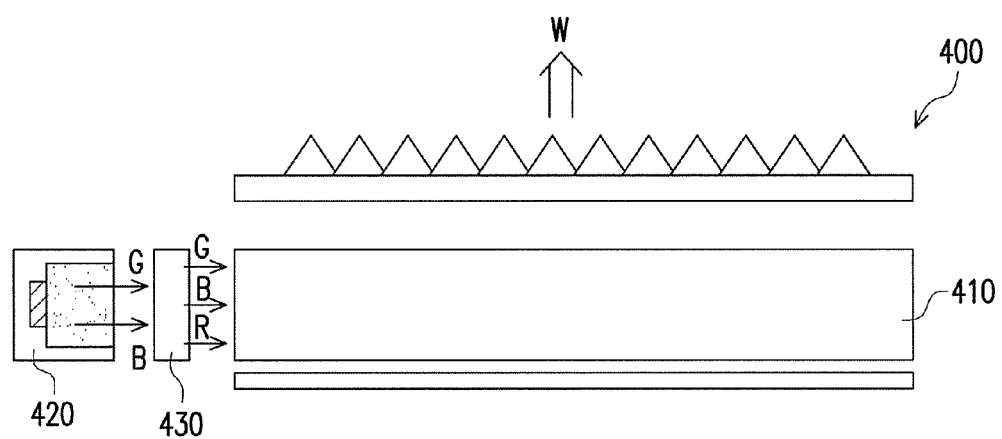
FIG. 2C is a schematic view of a light source module according to another embodiment of the invention.

However, the invention is not limited to the structural form of the light source module 100 as depicted by FIG. 1A, and an embodiment is further described below. FIG. 2A is a schematic view of a light source module according to another embodiment of the invention. In FIG. 2A, the light guide element 210 of the light source module 200 has a wedge-shaped portion 213 on a side near a light incident surface 212. A quantum dot element 230 has a light shielding portion 234 above the wedge-shaped portion 213. The wedge-shaped portion 213 guides a majority of light provided by the light-emitting element 220 into the light guide element 210, and the rest of the light guide element 210 can remain extremely thin to reduce the overall thickness of the light source module 200. The light shielding portion 234 can shield light emitted from the side edge of the light guide element, so as to prevent light leakage generating in the light source module 200. Moreover, the invention is not limited to having the quantum dot element being disposed on the light exiting surface. FIG. 2B is a schematic view of a light source module according to another embodiment of the invention. In FIG. 2B, a quantum dot element 330 of a light source module 300 is disposed between a light guide element 310 and a reflector elector 350, such that the first color light L emitted from a light-emitting element 320 can be converted by the quantum dot element 330 into the white light W. In addition, FIG. 2C is a schematic view of a light source module according to another embodiment of the invention. In FIG. 2C, a quantum dot element 430 of a light source module 400 is disposed between a light-emitting element 420 and a light guide element 410.

In view of the foregoing, in the light source modules according to the embodiments of the invention, the quantum dot element only needs to convert light of a specific wavelength. When the first color light emitted by the light-emitting element exits from the light exiting surface, the quantum dot element only converts a portion of the first color light into the first monochromatic light, and the first color light and the first monochromatic light are mixed into the white light. Since the quantum dot element of the invention only needs to convert light of a specific wavelength, the production costs of the quantum dot element can be effectively reduced. Moreover, when the first monochromatic light converted by the quantum dot element is a red light, the red color saturation in images displayed by the display panel can be enhanced. When the first color light of the light-emitting element is formed by a blue light and a green light, since the green light is directly provided by the light-emitting element without the need for conversion by the quantum dot element, the brightness of the light source module can be further increased.

Although the invention has been disclosed by the above embodiments, they are not intended to limit the invention. Anybody skilled in the art may make modifications and variations without departing from the spirit and scope of the present invention. Therefore, the protection range of the invention falls within the appended claims.

What is claimed is:

1. A light source module, comprising:
a light guide element having a light incident surface and a light exiting surface;
at least one light-emitting element disposed at the light incident surface for providing a first color light; and
a quantum dot element converting only a portion of the first color light into a first monochromatic light, wherein the first color light comprises a second monochromatic light and a third monochromatic light, the first monochromatic light, the second monochromatic light and the third monochromatic light are mixed into a white light, and the first monochromatic light, the second monochromatic light and the third monochromatic light have different wavelengths, and wherein the quantum dot element has an optical film coating on a side facing the light guide element for reflecting the first monochromatic light, and the optical film is located between the light guide element and the quantum dot element.

2. The light source module according to claim 1, wherein the quantum dot element is disposed at the light exiting surface of the light guide element.

3. The light source module according to claim 1, further comprising a reflector element disposed on a bottom surface of the light guide element opposite to the light exiting surface.

4. The light source module according to claim 1, wherein the first monochromatic light is a red light, and the first color light comprises a blue light and a green light.

5. The light source module according to claim 4, wherein the first color light further comprises a yellow light.

6. The light source module according to claim 4, wherein the light-emitting element comprises a blue light-emitting diode (LED) chip and a green phosphor, the green phosphor converts a portion of a blue light provided by the blue LED chip into a green light.

7. The light source module according to claim 1, wherein the first monochromatic light is an infrared light.

8. The light source module according to claim 7, wherein the infrared light has a wavelength between 850 nm to 940 nm.

9. The light source module according to claim 1, further comprising at least one brightness enhancement film, wherein the quantum dot element is disposed between the brightness enhancement film and the light exiting surface.

* * * * *